(12) United States Patent
Balakrishnan et al.

(10) Patent No.: US 10,903,210 B2
(45) Date of Patent: Jan. 26, 2021

(54) SUB-FIN DOPED BULK FIN FIELD EFFECT TRANSISTOR (FINFET), INTEGRATED CIRCUIT (IC) AND METHOD OF MANUFACTURE

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 197 days.

(21) Appl. No.: 14/704,760

(22) Filed: May 5, 2015

(65) Prior Publication Data
US 2016/0329326 A1 Nov. 10, 2016

(51) Int. Cl.
| | | |
|---|---|---|
| H01L 21/8238 | (2006.01) | |
| H01L 27/088 | (2006.01) | |
| H01L 29/10 | (2006.01) | |
| H01L 29/167 | (2006.01) | |
| H01L 21/8234 | (2006.01) | |
| H01L 29/06 | (2006.01) | |
| H01L 21/223 | (2006.01) | |
| H01L 21/324 | (2006.01) | |

(Continued)

(52) U.S. Cl.
CPC ........ *H01L 27/0886* (2013.01); *H01L 21/223* (2013.01); *H01L 21/324* (2013.01); *H01L 21/76224* (2013.01); *H01L 21/823431* (2013.01); *H01L 21/823481* (2013.01); *H01L 29/0649* (2013.01); *H01L 29/1083* (2013.01); *H01L 29/167* (2013.01); *H01L 29/66545* (2013.01); *H01L 29/66795* (2013.01); *H01L 29/66803* (2013.01); *H01L 29/785* (2013.01)

(58) Field of Classification Search
CPC ................ H01L 29/66795; H01L 29/785
See application file for complete search history.

(56) References Cited

U.S. PATENT DOCUMENTS

| | | | | |
|---|---|---|---|---|
| 4,963,502 A | * | 10/1990 | Teng ................. | H01L 21/28525 257/E21.166 |
| 4,987,088 A | * | 1/1991 | Bergonzoni .... | H01L 21/823807 257/E21.633 |

(Continued)

FOREIGN PATENT DOCUMENTS

| | | | | | |
|---|---|---|---|---|---|
| WO | WO 2013/044430 | * | 4/2013 | ........... | H01L 21/336 |
| WO | WO 2014/110851 | * | 7/2014 | ........... | H01L 21/336 |
| WO | WO 2014/110852 | * | 7/2014 | ........... | H01L 21/336 |

*Primary Examiner* — Jay C Kim
(74) *Attorney, Agent, or Firm* — Erik K. Johnson

(57) ABSTRACT

A field effect transistor (FET), integrated circuit (IC) chip including the FETs and a method of forming the IC. Fins on pedestals are defined, e.g., with a hard mask, in a fin layer on a semiconductor wafer and spaces between the pedestals are filled with dielectric material, e.g., shallow trench isolation (STI). Sacrificial sidewalls are formed along the sides of fins and pedestal sub-fins sidewalls are re-exposed. Pedestal sub-fins are doped with a punch-though dopant and punch-though dopant is diffused into the sub-fins and the bottoms of fins. After removing the hard mask and sacrificial sidewalls, metal FET gates are formed on the fins.

20 Claims, 8 Drawing Sheets

(51) Int. Cl.
  *H01L 21/762* (2006.01)
  *H01L 29/66* (2006.01)
  *H01L 29/78* (2006.01)

(56) References Cited

U.S. PATENT DOCUMENTS

| | | | | |
|---|---|---|---|---|
| 5,943,575 A * | 8/1999 | Chung | H01L 21/8234 | 257/E21.425 |
| 6,483,158 B1 * | 11/2002 | Lee | H01L 29/0653 | 257/344 |
| 6,812,103 B2 * | 11/2004 | Wang | H01L 29/0649 | 257/E21.43 |
| 6,992,010 B2 * | 1/2006 | Chou | H01L 21/28044 | 257/E21.198 |
| 7,122,871 B2 * | 10/2006 | Lee | H01L 21/823412 | 257/308 |
| 7,247,896 B2 * | 7/2007 | Oh | H01L 29/0653 | 257/192 |
| 7,285,812 B2 * | 10/2007 | Tang | H01L 21/28132 | 257/296 |
| 7,531,412 B2 * | 5/2009 | Yoon | H01L 27/10876 | 257/331 |
| 7,560,358 B1 * | 7/2009 | Kim | H01L 21/823828 | 257/E21.085 |
| 7,662,679 B2 * | 2/2010 | Izumida | H01L 29/66818 | 257/E21.394 |
| 7,759,198 B2 * | 7/2010 | Seo | H01L 27/10876 | 257/E21.41 |
| 7,935,619 B2 * | 5/2011 | Jung | H01L 27/228 | 438/514 |
| 7,968,442 B2 * | 6/2011 | Kang | H01L 29/7854 | 257/E29.255 |
| 7,993,989 B2 * | 8/2011 | Anderson | H01L 29/66795 | 438/149 |
| 8,080,458 B2 * | 12/2011 | Masuoka | H01L 29/42356 | 257/E21.41 |
| 8,134,209 B2 * | 3/2012 | Yagishita | H01L 21/823431 | 257/347 |
| 8,263,440 B2 * | 9/2012 | Kim | H01L 21/2257 | 257/302 |
| 8,278,184 B1 * | 10/2012 | Chen | H01L 21/823431 | 257/519 |
| 8,357,969 B2 * | 1/2013 | Sung | H01L 29/7827 | 257/329 |
| 8,455,307 B2 * | 6/2013 | Cho | H01L 21/823431 | 257/288 |
| 8,486,808 B2 * | 7/2013 | Nojima | H01L 27/10876 | 257/E21.09 |
| 8,497,171 B1 * | 7/2013 | Wu | H01L 21/823821 | 438/199 |
| 8,552,472 B2 * | 10/2013 | Kim | H01L 27/10876 | 257/242 |
| 8,557,692 B2 * | 10/2013 | Tsai | H01L 21/26513 | 257/611 |
| 8,575,653 B2 * | 11/2013 | Rachmady | B82Y 10/00 | 257/192 |
| 8,575,708 B2 * | 11/2013 | Lin | H01L 29/66795 | 257/327 |
| 8,598,003 B2 * | 12/2013 | Murtthy | 257/E21.431 | |
| 8,598,595 B2 * | 12/2013 | Zhu | H01L 29/66636 | 257/316 |
| 8,610,201 B1 | 12/2013 | Hokazono | | |
| 8,642,409 B2 * | 2/2014 | Nakazawa | H01L 29/7851 | 257/E21.413 |
| 8,691,640 B1 * | 4/2014 | LiCausi | H01L 29/66795 | 257/E21.421 |
| 8,697,511 B2 * | 4/2014 | Masuoka | H01L 29/66477 | 438/197 |
| 8,710,556 B2 * | 4/2014 | Zhu | H01L 29/66636 | 257/288 |
| 8,722,431 B2 * | 5/2014 | Pradhan | H01L 21/26513 | 438/4 |
| 8,729,638 B2 * | 5/2014 | Zhu | H01L 29/66795 | 257/369 |
| 8,772,175 B2 * | 7/2014 | Masuoka | H01L 29/66666 | 257/350 |
| 8,809,173 B1 | 8/2014 | Yin et al. | | |
| 8,841,188 B2 * | 9/2014 | Reznicek | H01L 21/823821 | 257/401 |
| 8,940,602 B2 * | 1/2015 | Basker | H01L 29/785 | 257/368 |
| 8,940,640 B2 * | 1/2015 | Xiao | H01L 29/7848 | 257/E21.215 |
| 8,956,942 B2 * | 2/2015 | Loubet | H01L 21/823431 | 438/164 |
| 8,957,477 B2 | 2/2015 | Chang et al. | | |
| 8,969,932 B2 * | 3/2015 | Wei | H01L 29/66795 | 257/213 |
| 9,000,522 B2 * | 4/2015 | Cheng | H01L 21/76283 | 257/347 |
| 9,006,065 B2 * | 4/2015 | Yen | H01L 29/66803 | 257/347 |
| 9,023,715 B2 * | 5/2015 | Faul | H01L 21/2255 | 438/434 |
| 9,035,430 B2 * | 5/2015 | Vega | H01L 21/3081 | 257/192 |
| 9,082,698 B1 * | 7/2015 | Joshi | H01L 29/66795 | |
| 9,093,477 B1 * | 7/2015 | Lin | H01L 29/66803 | |
| 9,093,532 B2 * | 7/2015 | Cheng | H01L 29/785 | |
| 9,117,690 B2 * | 8/2015 | Masuoka | H01L 29/775 | |
| 9,142,651 B1 * | 9/2015 | Xie | H01L 29/66818 | |
| 9,178,064 B2 * | 11/2015 | Sudo | H01L 29/785 | |
| 9,202,920 B1 * | 12/2015 | Liu | H01L 29/785 | |
| 9,209,185 B2 * | 12/2015 | Ching | H01L 29/16 | |
| 9,263,549 B2 * | 2/2016 | Rodder | H01L 29/66537 | |
| 9,269,792 B2 * | 2/2016 | Cheng | H01L 29/66795 | |
| 9,275,905 B1 * | 3/2016 | Wen | H01L 21/823807 | |
| 9,293,587 B2 * | 3/2016 | Jacob | H01L 29/785 | |
| 9,349,658 B1 * | 5/2016 | Jacob | H01L 29/0649 | |
| 9,362,308 B2 * | 6/2016 | Nagumo | H01L 27/1211 | |
| 9,368,569 B1 * | 6/2016 | Leobandung | H01L 29/66795 | |
| 9,390,976 B2 * | 7/2016 | Guo | H01L 29/7833 | |
| 9,397,096 B2 * | 7/2016 | Zhu | H01L 21/823821 | |
| 9,419,112 B2 * | 8/2016 | Zhu | H01L 29/1083 | |
| 9,431,504 B2 * | 8/2016 | Yin | H01L 29/4916 | |
| 9,450,078 B1 * | 9/2016 | Tang | H01L 29/66795 | |
| 9,502,560 B2 * | 11/2016 | Zhu | H01L 29/66795 | |
| 9,515,172 B2 * | 12/2016 | Shin | H01L 21/324 | |
| 9,583,621 B2 * | 2/2017 | Zhu | H01L 21/823431 | |
| 9,583,625 B2 * | 2/2017 | Wu | H01L 29/7851 | |
| 9,627,480 B2 * | 4/2017 | Chou | H01L 29/0847 | |
| 9,691,624 B2 * | 6/2017 | Zhu | H01L 21/823431 | |
| 9,698,225 B2 * | 7/2017 | Leobandung | H01L 29/1083 | |
| 9,748,363 B2 * | 8/2017 | Tsai | H01L 29/66803 | |
| 9,806,154 B2 * | 10/2017 | Tsai | H01L 29/7851 | |
| 9,825,135 B2 * | 11/2017 | Zhu | H01L 21/76897 | |
| 10,290,636 B2 * | 5/2019 | Liu | H01L 27/0924 | |
| 2010/0327363 A1 | 12/2010 | Nakabayashi | H01L 29/785 | 257/368 |
| 2011/0068401 A1 * | 3/2011 | Izumida | H01L 21/823431 | 257/347 |
| 2012/0052640 A1 * | 3/2012 | Fischer | H01L 21/823425 | 438/268 |
| 2013/0270638 A1 * | 10/2013 | Adam | H01L 29/66795 | 257/347 |
| 2013/0316513 A1 * | 11/2013 | Basker | H01L 21/845 | 438/400 |
| 2014/0117462 A1 * | 5/2014 | Cheng | H01L 29/66803 | 257/410 |
| 2014/0191321 A1 * | 7/2014 | Cheng | H01L 27/10826 | 257/347 |
| 2014/0319543 A1 | 7/2014 | Yin et al. | | |
| 2014/0239355 A1 | 8/2014 | Yin et al. | | |
| 2014/0377926 A1 * | 12/2014 | Kim | H01L 29/66795 | 438/289 |
| 2015/0001591 A1 | 1/2015 | Akarvardar et al. | | |
| 2015/0044829 A1 | 2/2015 | Kim et al. | | |

(56) References Cited

U.S. PATENT DOCUMENTS

| | | | | |
|---|---|---|---|---|
| 2015/0303284 A1* | 10/2015 | Basker | ................ | H01L 21/324 257/288 |
| 2015/0357468 A1* | 12/2015 | Zhu | ................ | H01L 29/66545 257/192 |
| 2016/0049516 A1* | 2/2016 | Huang | ............... | H01L 27/0886 257/401 |

* cited by examiner

SUB-FIN DOPED BULK FIN FIELD EFFECT TRANSISTOR (FINFET), INTEGRATED CIRCUIT (IC) AND METHOD OF MANUFACTURE

BACKGROUND OF THE INVENTION

Field of the Invention

The present invention is related to semiconductor devices and manufacturing and more particularly to fin field effect transistors (FinFETs) formed on semiconductor wafers and methods of manufacturing Integrated Circuits (ICs) with circuits including FinFETs.

Background Description

Integrated Circuit (IC) chip density and performance are primary semiconductor technology development goals. Increased chip density (the average density of circuit transistors on a chip) and chip die size has increased the number of transistors packed on a single chip. Typically, chip density has been achieved by shrinking features sizes to pack more transistors in the same area. Another state of the art approach to increasing field effect transistor (FET) density is forming FETs vertically on narrow semiconductor surface ridges or fins. Minimum feature sized lines of semiconductor material are formed on the surface of a bulk semiconductor wafer or from the surface layer of a silicon on insulator (SOI) wafer. The semiconductor lines or ridges form fins on the surface with gates formed on the fins for tightly packed vertical FETs. These vertical FETs are known as FinFETs.

Semiconductor technology and chip manufacturing advances also have resulted in a steady increase of on-chip clock frequencies, coupled with a corresponding decrease in chip supply voltage and chip feature size. Generally, all other factors being constant, the power consumed by a given clocked unit increases linearly with the frequency of switching within it. Thus, not withstanding the decrease of chip supply voltage, chip power consumption has increased as well. Both at the chip and system levels, cooling and packaging costs have escalated as a natural result of this increase in chip power. For low end systems (e.g., wearables, handhelds, portable and mobile systems), where battery life is crucial, net power consumption reduction is important but, must be achieved without degrading performance below acceptable levels.

To minimize power consumption, most ICs used in such low end systems (and elsewhere) are made in the well-known complementary insulated gate FET technology known as CMOS. A typical CMOS circuit includes paired complementary devices, i.e., an n-type FET (NFET) paired with a corresponding p-type FET (PFET), usually gated by the same signal. Since the pair of devices have operating characteristics that are, essentially, opposite each other, when one device (e.g., the NFET) is on and conducting (ideally modeled as a closed switch), the other device (the PFET) is off, not conducting (ideally modeled as an open switch) and, vice versa.

For example, a CMOS inverter is a series connected PFET and NFET pair that are connected between a power supply voltage ($V_{dd}$) and ground (GND). Both are gated by the same input and both drive the same output, the PFET pulling the output high and the NFET pulling the output low at opposite input signal states. Ideally, when the gate of a NFET is below some positive threshold voltage ($V_T$) with respect to its source, the NFET is off, i.e., the switch is open. Above $V_T$, the NFET is on conducting current ($I_{on}$), i.e., the switch is closed. Similarly, a PFET is off ($I_{off}$=0) when its gate is above its $V_T$, i.e., less negative, and on below $V_T$. Thus, ideally, the CMOS inverter in particular and CMOS circuits in general pass no static (DC) current. So, ideally, device on to off current ratios ($I_{on}/I_{off}$) are very large and, ideal CMOS circuits use no static or DC power, consuming only transient power from charging and discharging capacitive loads.

In practice however, transient power for circuit loads accounts for only a portion of the power consumed by CMOS circuits. A typical FET is much more complex than a switch. FET drain to source current (and so, power consumed) is dependent upon circuit conditions and device voltages. FETs are known, however, to conduct parasitic leakages currents, e.g., subthreshold current and punch through current. These parasitic leakages currents result in unwanted, wasted power consumption.

Subthreshold current increases with the magnitude of the device's drain to source voltage ($V_{ds}$) and inversely with the magnitude of the device $V_T$. Among other things, $V_T$ is inversely proportional to gate oxide thickness and, to some extent channel length, both of which are related to feature size. In addition, gate leakages, such as gate to channel, gate to source or drain and gate induced drain leakage (GIDL), which are also related in particular to oxide thickness, contribute to static power consumption. Punch through current is a passive current that is, essentially, a bipolar transistor (pnp or npn) current that flows when the channel (p or n) separation of the source and drain (n or p) is such that the source and drain junction space charges meet or merge. Multiplied by the millions, and even billions, of devices on a state of the art IC, even 100 picoAmps (100 pA) of punch through leakage current in each device, for example, can result in chip leakage on the order of 100 milliAmps (100 mA). Thus, as chip features shrink, these parasitic leakage sources become more predominant.

FinFET channels are thinner and shorter than typical horizontal FETs for consistent channel tailoring. Unfortunately, fin doping tends to fluctuate unacceptably. FinFETs provide better short channel effect control than for partially depleted SOI FETs, but bulk substrate FinFETs require a punch-through stop doping under the fins to control the off-state leakage. Doping under the fins using typical state of the art ion-implantation techniques has caused device defects, especially for strained epitaxial fins such as SiGe on silicon. These defects have caused strain relaxation that resulted in yield loss with a corresponding increase in manufacturing costs. Moreover, a typical ion-implant can exhibit a tail that unintentionally dopes the fin channel, causing coulombic scattering that degrades channel mobility for reduced on-current flow.

Thus, there is a need for reducing parasitic device currents and on to off current ratios, and more particularly, for reducing punch-through current in bulk FinFETs without strain relaxation defects and degraded device performance.

SUMMARY OF THE INVENTION

It is a purpose of the invention to improve device on-to-off current ratios;

It is another purpose of the invention to improve device leakage control;

It is yet another purpose of the invention to improve punch-through current in bulk FinFETs;

It is yet another purpose of the invention to reduce punch-through current in bulk FinFETs without strain relaxation defects and degraded device performance.

The present invention relates to a field effect transistor (FET), integrated circuit (IC) chip including the FETs and a method of forming the IC. Fins on pedestals are defined, e.g., with a hard mask, in a fin layer on a semiconductor wafer and spaces between the pedestals are filled with dielectric material, e.g., shallow trench isolation (STI). Sacrificial sidewalls are formed along the sides of fins and pedestal sub-fins sidewalls are re-exposed. Pedestal sub-fins are doped with a punch-though dopant and punch-though dopant is diffused into the sub-fins and the bottoms of fins. After removing the hard mask and sacrificial sidewalls, metal FET gates are formed on the fins.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1:
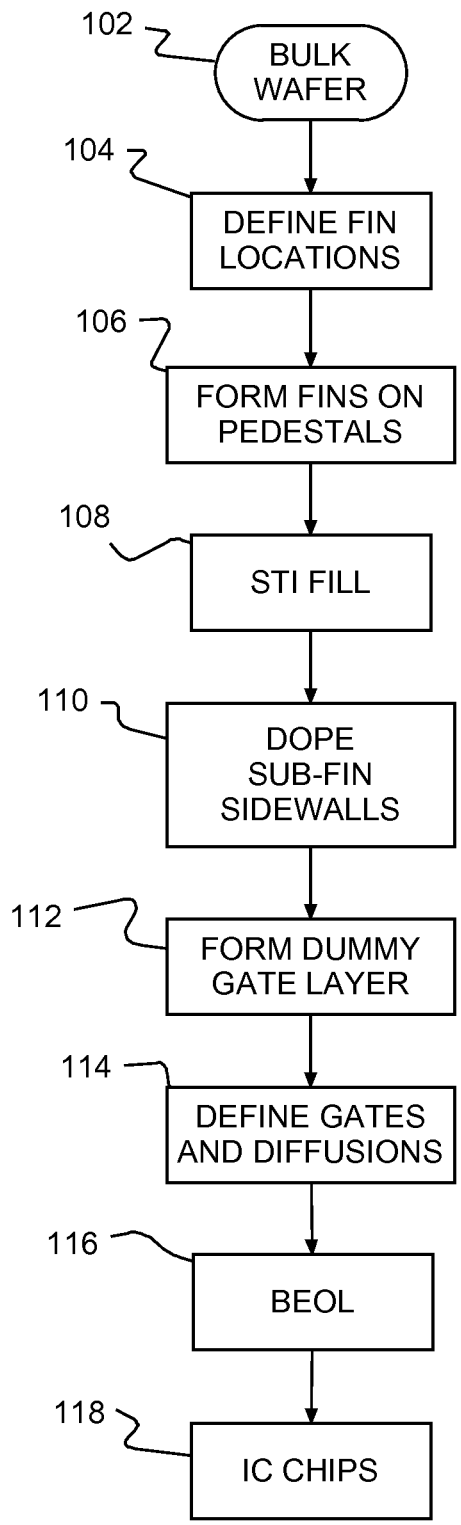
FIG. 1 shows an example of a preferred embodiment method for forming field effect transistors (FETs) and, more particularly FinFETs, according to the present invention.

Turning now to the drawings and, more particularly, FIG. 1 shows an example of a preferred embodiment method for forming field effect transistors (FETs), e.g., in an integrated circuit (IC) and, more particularly forming FinFETs, according to the present invention. Circuit/device formation begins in step 102 with a typical bulk semiconductor wafer. In step 104 device fins are defined on a fin layer, which may be a strained layer. In step 106 fins are formed on pedestals that are formed coincidentally from the upper surface of the semiconductor wafer. Then in step 108, the space between the pedestals is filled to the upper surface of the semiconductor wafer, e.g., using a typical shallow trench isolation (STI) technique.

In step 110 the upper ends are the pedestals are doped without substantially doping the fins. Preferably, the STI is recessed to expose fin sidewalls. A sidewall spacer protects the fin sidewalls and the STI is further recessed, to expose the upper ends of the pedestals or sub-fins. Preferably, the exposed sub-fins are doped using a gas phase doping or atomic layer doping. Sub-fin doping may be followed by a rapid thermal anneal (RTA) that diffuses dopant into the bottom of the fin without any crystallographic damage to the fins. Thus, avoiding crystallographic damage maintains interlayer (fin-pedestal) stress. Once fin and pedestal doping and diffusion are complete, the sidewall spacers are removed, the STI is regrown, and again recessed to reveal the strained fins.

Then in step 112, dummy gate dielectric and a dummy (semiconductor) gate layer are formed on the fins. In step 114 the dummy gate layer is patterned to define gates, and the patterned dummy gates and dummy gate layer may be replaced, e.g., with high-k dielectric and metal gates. In step 116 device definition (e.g., source/drain formation) and processing continues, forming source/drain diffusions and with normal back end of the line (BEOL) steps, e.g., wiring devices together and wiring circuits together, to pads and off chip to complete Integrated circuit (IC) chip definition 118.

Figure 2:
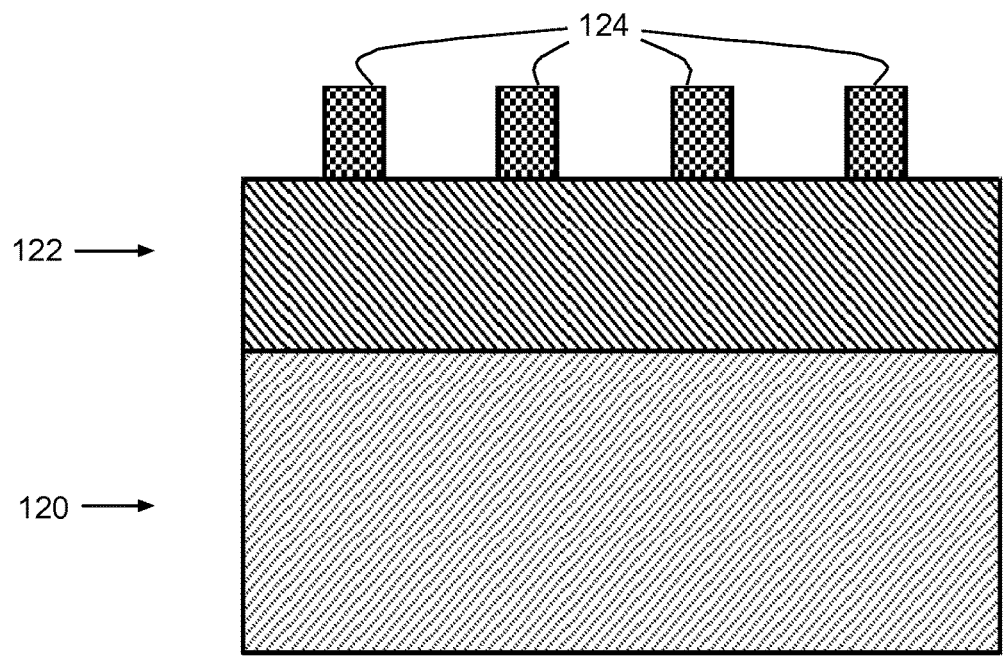
FIG. 2 shows a cross section of a preferred bulk semiconductor wafer, provided for forming preferred embodiment FinFETs.

FIG. 2 shows a cross section of a preferred bulk semiconductor wafer 120, provided 102 for forming preferred embodiment FinFETs according to the example of FIG. 1. A fin channel layer 122 is formed on the bulk wafer 120. Preferably, the bulk wafer 120 is silicon (Si) or a III-V semiconductor material, and the fin channel layer 122 is a 10-100 nanometer (10-100 nm), preferably 25-50 nm, thick layer of semiconductor material. The semiconductor material may be Si, Germanium (Ge), SiGe or a III-V semiconductor material and, preferably, is Si. A hard mask 124 is formed on the fin channel layer 122 to define device fins 104. Preferably, the hard mask 124 is formed using sidewall image transfer or lithographically, e.g., masking and etching a hard mask layer of oxide, nitride or oxy-nitride and, preferably, silicon nitride lithographically, e.g., masking and etching a hard mask layer of etch resistance oxide such as Hafnium oxide, nitride or any other material which is resistance to the etchant of STI dielectric 132 and, preferably, silicon nitride.

Figure 3A:
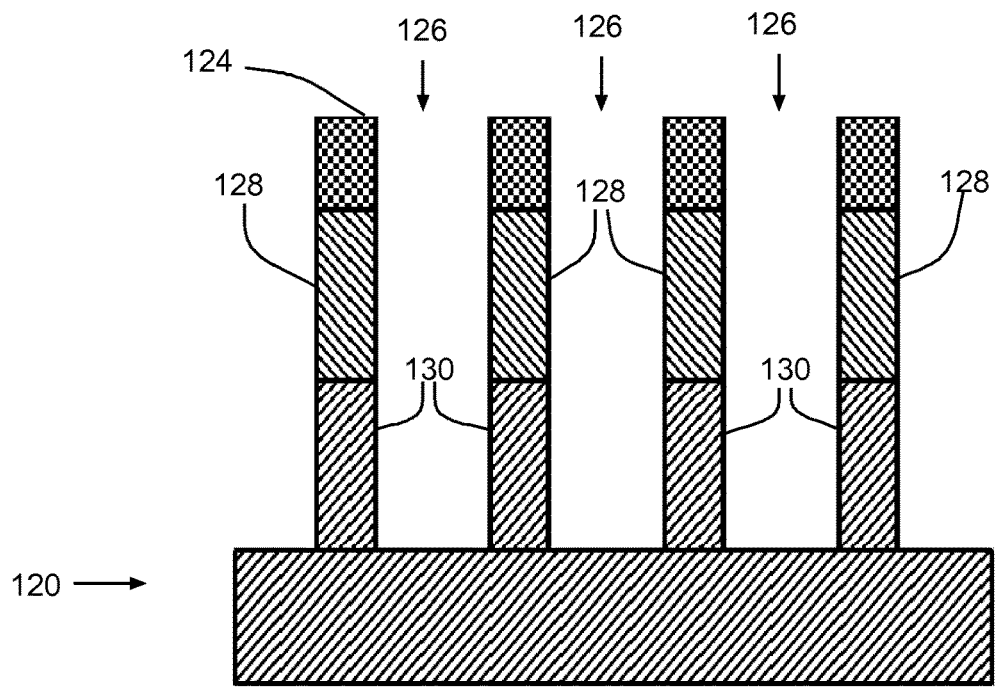
FIGS. 3A-B show shallow trench isolation (STI) defining fins on bulk pedestals with dielectric (STI) material filling between the pedestals.
Figure 3B:
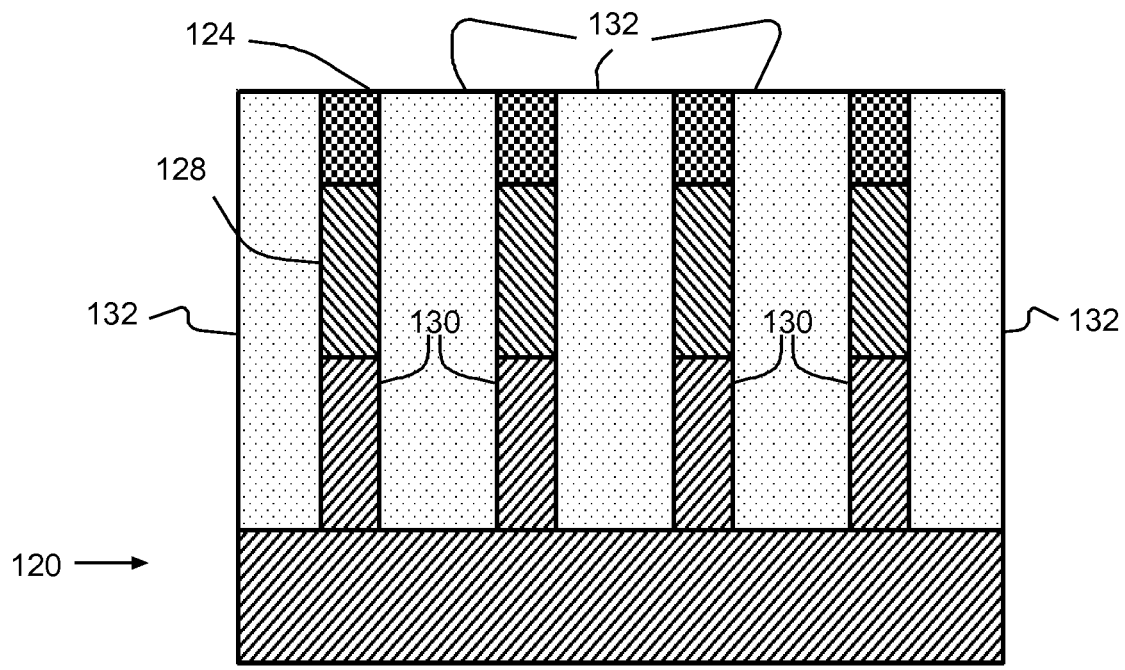
Figure 4A:
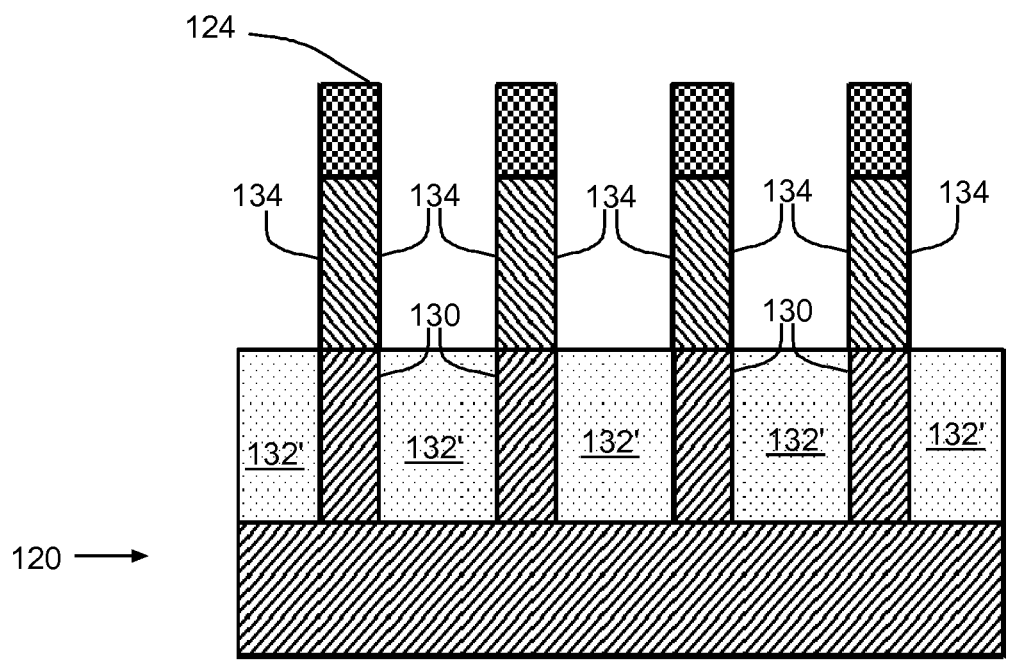
FIGS. 4A-D show doping the upper ends of the pedestals.
Figure 4B:
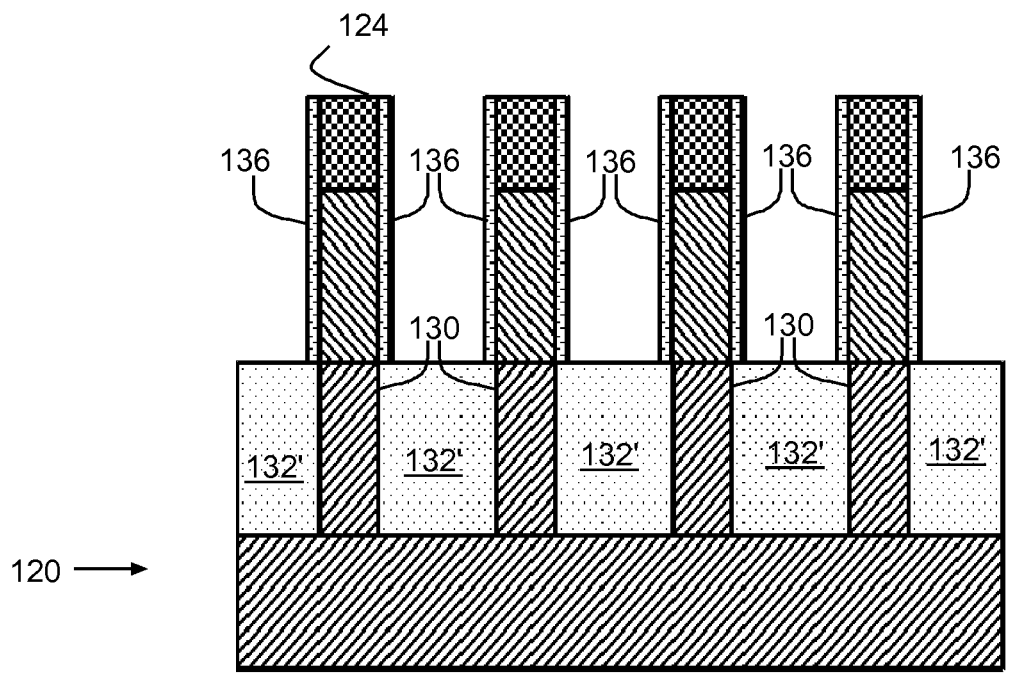
Figure 4C:
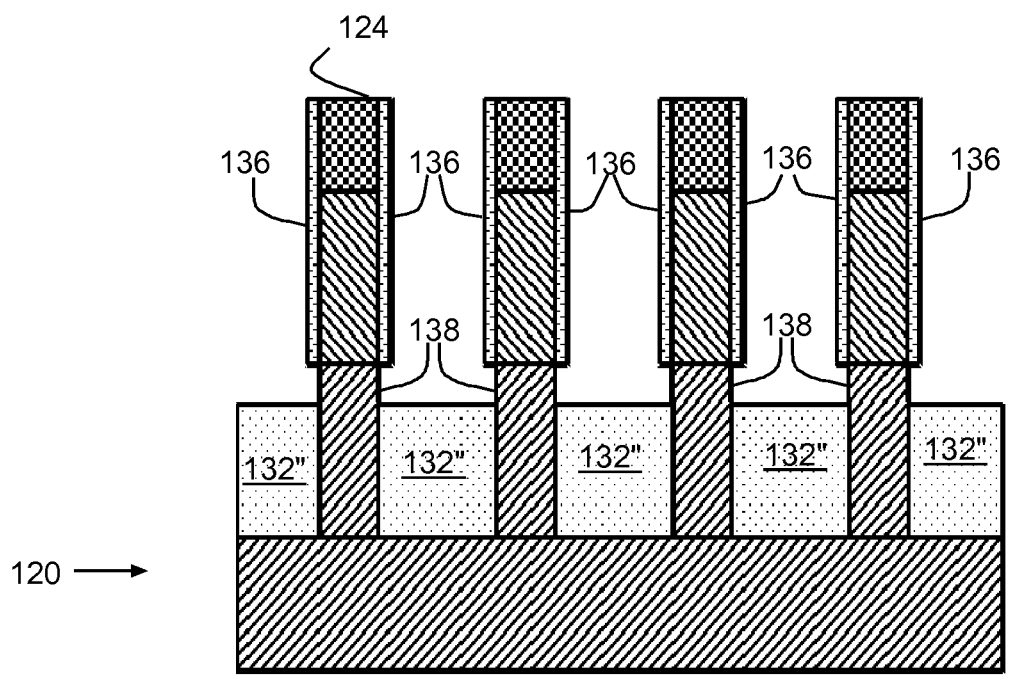
Figure 4D:
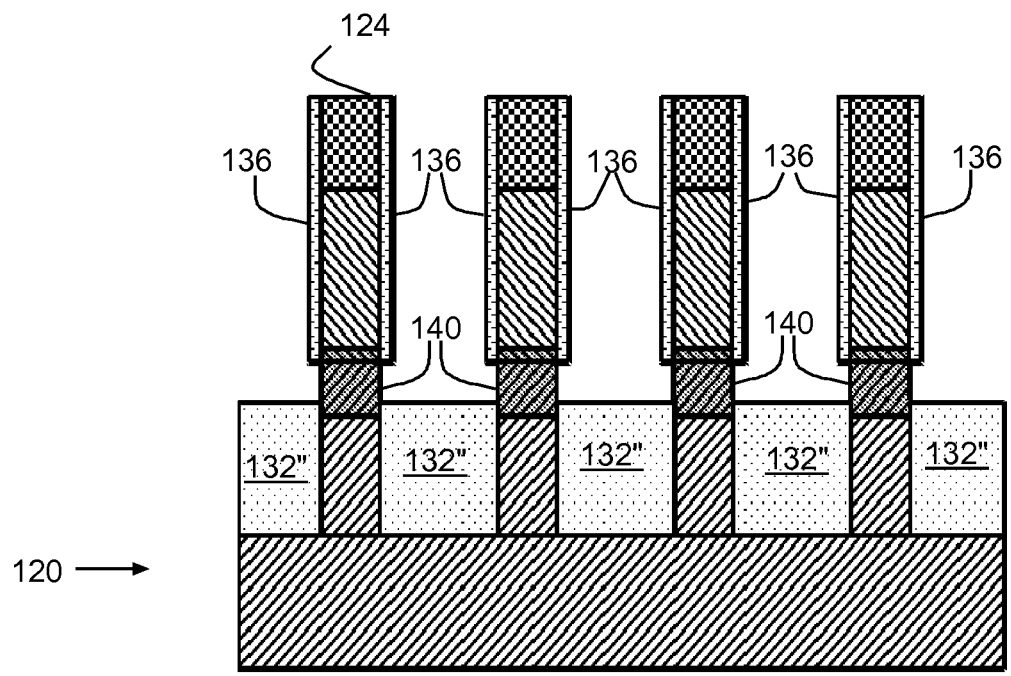
Figure 5A:
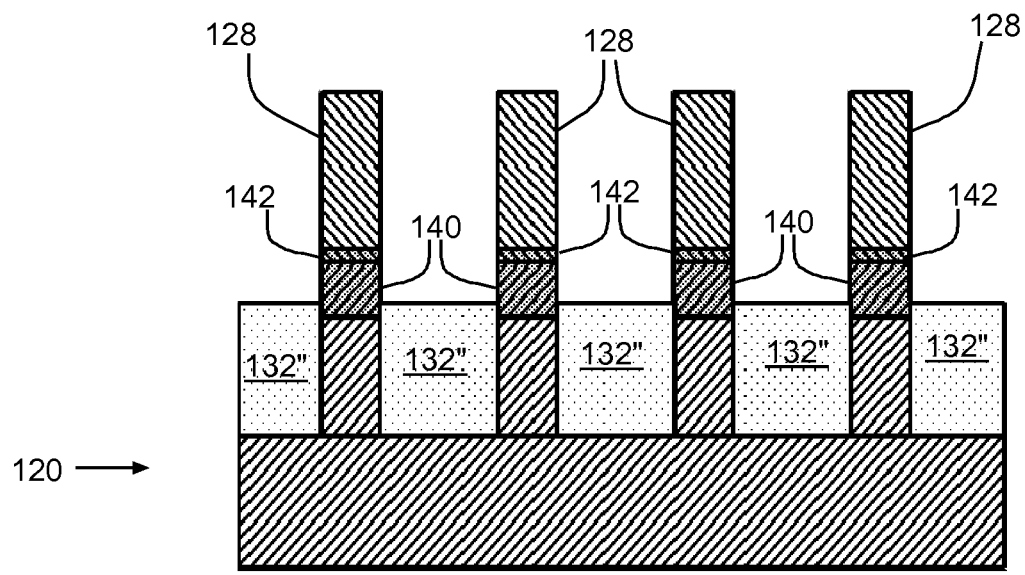
FIGS. 5A-D show an example of forming and patterning dummy gates formed on the fins to define gates, e.g., for replacement metal gates.
Figure 5B:
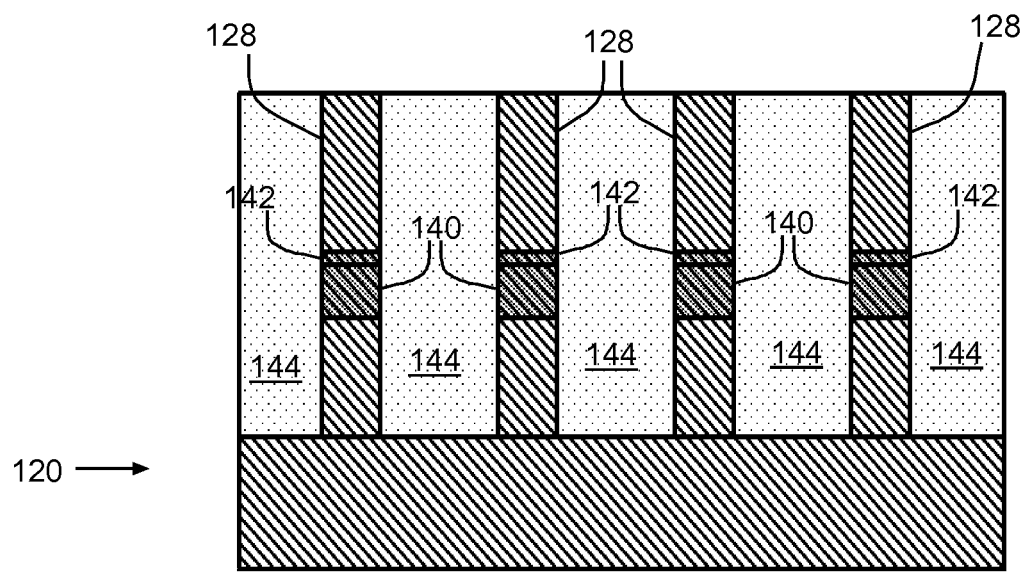
Figure 5C:
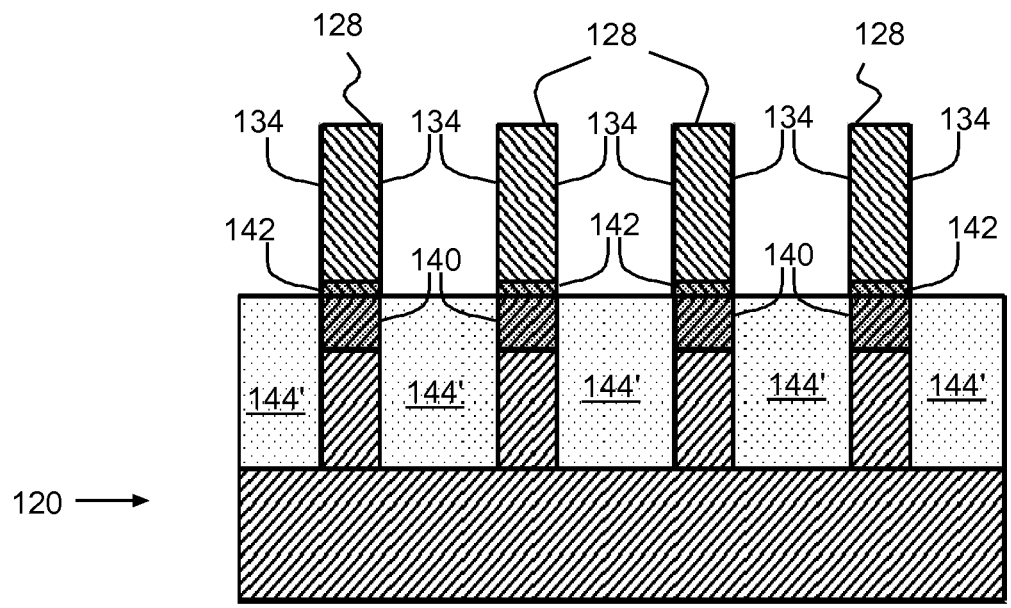
Figure 5D:
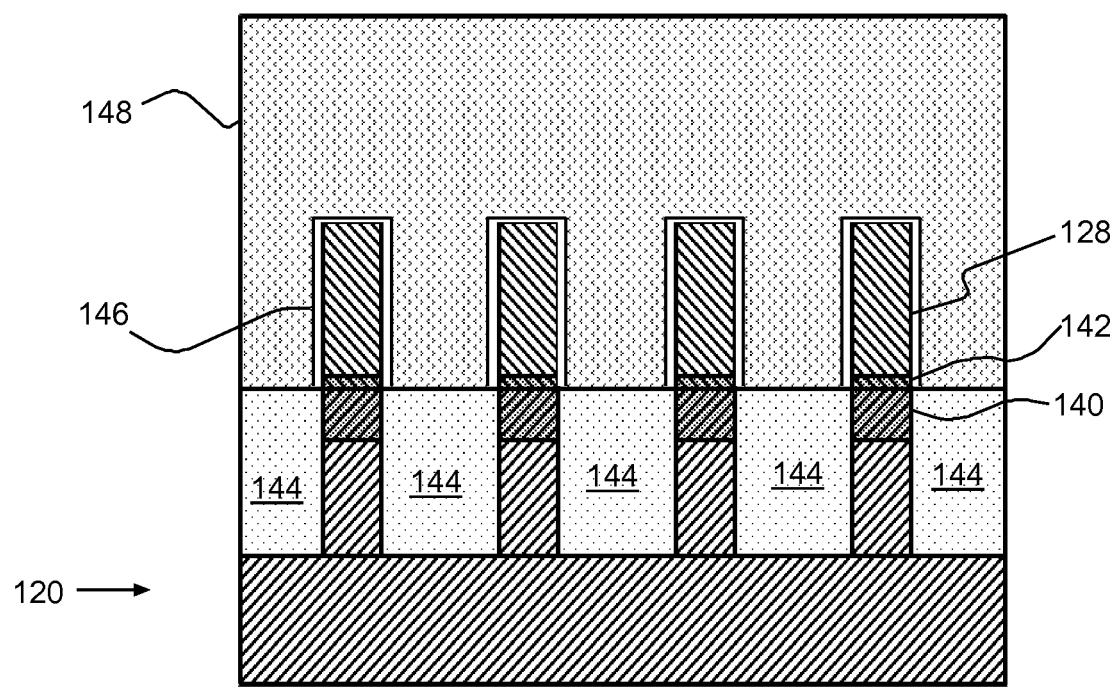

FIGS. 3A-B show shallow trench isolation (STI) defining fins on bulk pedestals with dielectric (STI) material filling between the pedestals. Once the hard mask 124 is formed, as shown in FIG. 3A, trenches 126 define (106 in FIG. 1) fins 128 on bulk pedestals 130. The trenches 126 are etched at least 20 nm deep into the bulk wafer 120. Preferably, the shallow trenches 126 are 15-45 nm wide and etched 30 nm into the bulk wafer 120, e.g., using a typical reactive ion etch (RIE). Preferably, the fins 128 and pedestals are 5-15 nm wide. Dielectric material 132 fills the trenches 108 to the upper surface of the pedestals at the interface with the fins for shallow trench isolation (STI) between the pedestals. Preferably in FIG. 3B, the STI dielectric material 132 is oxide grown to fill the trenches 126, followed by a chemical mechanical (chem-mech) polish (CMP) to the hard mask 124 to remove excess oxide.

After filling the trenches, the upper ends of the pedestals, or sub-fins, are doped (110 in FIG. 1) as shown in FIGS. 4A-D. First, the STI dielectric material 132' is recessed to the bulk pedestals 130 to expose the fin sidewalls 134, e.g., with a typical wet etch that is selective to the particular STI dielectric material. Next, sidewall spacers 136 are formed along the fin sidewalls 134. Preferably, the sidewall spacers 136 are formed by forming a conformal nitride layer and etching with a directional etch, e.g., RIE, to remove horizontal portions of the layer. After forming the sidewall spacers 136 sub-fins 138 are exposed and doped. Thus, the STI dielectric material 132" is further recessed to expose 10-20 nm of the upper ends of the bulk pedestals, or sub-fins 138. The exposed sub-fins 138 are doped with a suitable dopant, e.g., using a gas phase doping or Atomic layer doping. Preferably, sub-fins 138 at P-type FinFETs or PFETS are doped with arsenic (As) or phosphorous (P) and sub-fins 138 at N-type FinFETs or NFETs are doped with boron (B). The sub-fin dopant is activated/diffused 140 using a typical state of the art Rapid Thermal Processing/Rapid Thermal Anneal (RTP/RTA). Thus, the RTP/RTA diffuses 3-10 nm into the fin bottom ends 142 without crystallographic damage to the channel in upper fin layer 144, and for strained layer fins, maintains the crystallographic stress.

FIGS. 5A-D show an example of the first steps in forming and patterning (112 and 114, respectively, in FIG. 1) dummy gates formed on the fins 128 for defining gates, e.g., for replacement metal gates. First, the hard mask 124 and sidewall spacers 136 are removed to expose the fins 128, e.g., using a nitride strip, such as hot phosphoric acid for nitride. Then, the shallow trenches are re-filled, e.g., by re-growing STI dielectric material 144 and planarizing with a CMP to the top of the fins 128. Again, the STI dielectric material 144' is recessed to top of the bulk pedestals 130 to re-expose the fin sidewalls 134, e.g., with a typical wet etch that is selective to the particular dielectric material. For a replacement metal gate (RMG) technology a dummy gate dielectric 146 and a dummy (semiconductor) gate layer 148 are formed on the fins 128.

Figure 6:
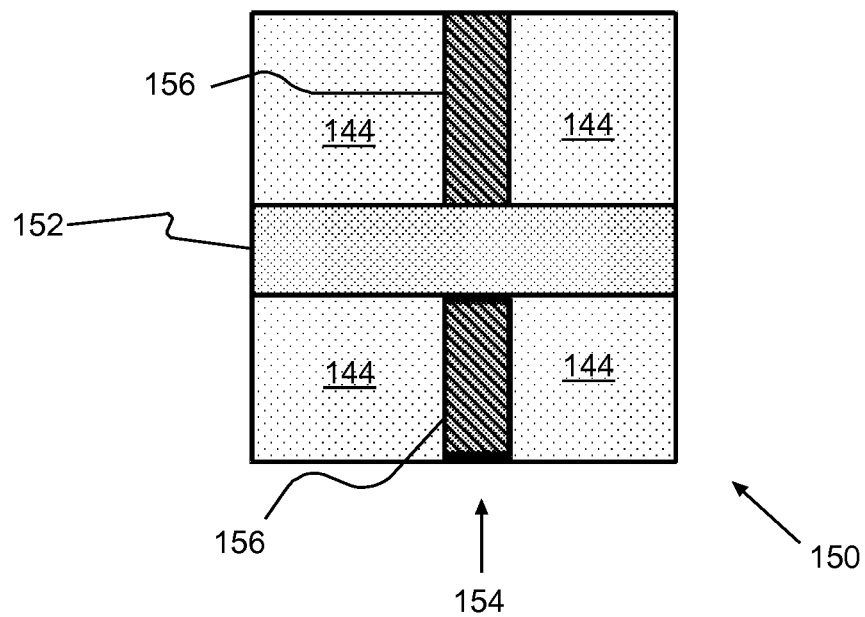
FIG. 6 shows a plan view of a preferred FinFET.

FIG. 6 is a plan view of a preferred FinFET 150 formed as described in the above Figures with like features labeled identically. The patterned dummy gate 152 extends over STI 144 defining fin 154. After patterning dummy gates 152, in device definition (116 in FIG. 1) the fin 154 is doped with a source/drain implant to define source/drain regions 156 at both ends of the dummy gates 152. Thereafter, a field dielectric is formed on the wafer, and the dummy gates and gate dielectric are removed and replaced, e.g., with high-k dielectric and metal gates in a typical RMG process.

Figure 7:
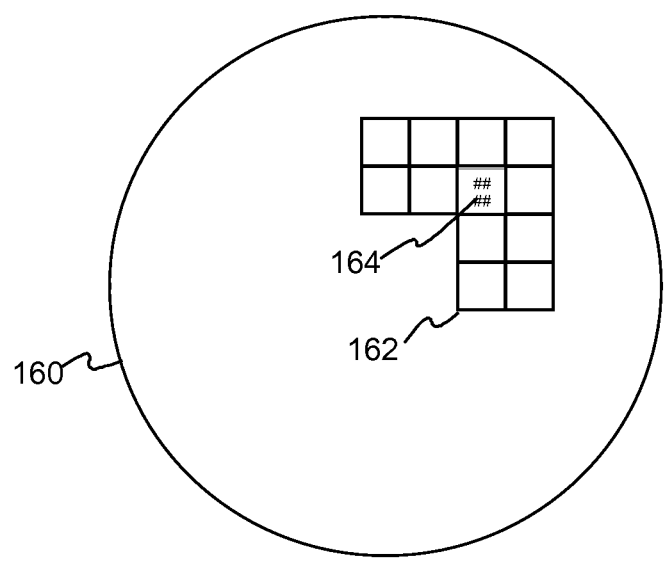
FIG. 7 shows an example of a wafer with completed IC chips after normal BEOL.

FIG. 7 shows an example of a wafer 160 with completed IC chips 162 after normal BEOL (118 in FIG. 1), with devices wired together and into circuits that are connected to pads and off chip. After replacing dummy gates (152 in FIG. 6) with metal, wiring layers are formed using a suitable metal formation process, e.g., in a dual damascene metal line formation step, to connect FinFETs 150 into circuits. The metal lines on upper layers (not shown) wire chip FETs into chip circuits 164 and chip circuits 164 together. One or more of the connected circuits 164 includes at least one preferred FinFET 150.

Advantageously, preferred FinFETs are formed on bulk substrates with requisite punch-through stop doping under the fins for improved FinFET off-state leakage control. Bulk substrate sub-fins are implanted relatively simply, using a gas phase doping or Atomic layer doping with a suitable dopant. This implant, followed by a typical RTP/RTA activates/diffuses the dopant while avoiding defects, especially for strained epitaxial fins, such as SiGe, and especially, avoiding appurtenant strain relaxation. Because the ion-implant is well controlled, it avoids unintentionally doping the channel fins, and the associated coulombic scattering that degrades channel (fin) mobility.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming an integrated circuit (IC) including a plurality of FinFETs, said method comprising:
    forming a fin layer on an upper surface of a wafer, said wafer being a first semiconductor material and said fin layer being a second semiconductor material;
    defining fins on pedestals on said wafer, wherein said defining fins on pedestals comprises:
        forming a patterned hard mask on said fin layer, and
        etching said fin layer in exposed areas of the patterned hard mask and continuing said etching into the upper surface of said wafer, said pedestals being formed from said etching into said upper surface, said fins being defined on said pedestals from said fin layer;
    forming a dielectric material filling between said pedestals to a plurality of upper surfaces of the pedestals;
    forming sacrificial sidewalls along sides of said fins, wherein said dielectric material and a material of the sacrificial sidewalls are selectively etchable to each other;
    exposing sidewalls of upper portions of said pedestals below said sacrificial sidewalls, said upper portions being pedestal sub-fins;
    forming anti punch-through diffusion regions in said pedestal sub-fins; and
    forming FET gates on said fins.

2. A method of forming an IC as in claim 1, wherein forming the anti punch-through diffusion regions comprises:
    gas phase doping the exposed sub-fin sidewalls with a dopant; and
    Rapid Thermal Processing/Rapid Thermal Annealing (RTP/RTA) to activate and diffuse said dopant.

3. A method of forming an IC as in claim 2, wherein said dopant is boron (B) for N-type FETs (NFETs), and is dopant selected from arsenic (As) and phosphorous (P) for P-type FETs (PFETs).

4. A method of forming an IC as in claim 1, wherein forming the anti punch-through diffusion regions comprises:
    atomic layer doping the exposed sub-fin sidewalls with a dopant; and
    Rapid Thermal Processing/Rapid Thermal Annealing (RTP/RTA) to activate and diffuse said dopant.

5. A method of forming an IC as in claim 4, wherein said dopant is boron (B) for N-type FETs (NFETs), and said dopant is selected from arsenic (As) and phosphorous (P) for P-type FETs (PFETs).

6. A method of forming an IC as in claim 1, wherein etching said exposed areas of the patterned hard mask forms trenches and forming the dielectric material filling between said pedestals comprises:
    filling said trenches with said dielectric material; and
    etching said dielectric material to the top surfaces of said pedestals.

7. A method of forming an IC as in claim 6, wherein forming said sacrificial sidewalls comprises:
    forming a conformal layer of said sacrificial sidewall material on said wafer; and
    removing horizontal portions of said conformal layer, said sacrificial sidewalls remaining, each sacrificial sidewall extending from the etched trench dielectric material to the patterned hard mask on said fins.

8. A method of forming an IC as in claim 7, wherein exposing the sub-fin sidewalls comprises etching the trench dielectric material.

9. A method of forming an IC as in claim 1, wherein forming the FET gates comprises:
    removing the patterned hard mask and sacrificial sidewalls; forming dummy semiconductor gates on said fins;
    forming source/drain diffusions in said fins at opposite ends of said dummy semiconductor gates; and
    replacing said dummy semiconductor gates with metal.

10. A method of forming an IC as in claim 1, wherein etching through said fin layer and said upper surface comprises using a reactive ion etch (RIE) through said patterned hard mask.

11. A method of forming an IC as in claim 7, wherein removing horizontal portions of said conformal layer comprises directionally etching said conformal layer.

12. A method of forming an integrated circuit (IC) including a plurality of FinFETs, said method comprising:
   forming a fin layer on an upper surface of a wafer, said wafer being a first semiconductor material and said fin layer being a second semiconductor material;
   defining fins on pedestals on said wafer, said defining comprising:
   forming a patterned hard mask on said fin layer, and
      etching trenches in exposed areas through said fin layer in exposed areas of the patterned hard mask and continuing said etching through the upper surface of said wafer, said pedestals being formed from said etching into said upper surface, said fins being defined on said pedestals from said fin layer;
   forming a dielectric material filling between said pedestals to a plurality of upper surfaces of the pedestals;
   forming sacrificial sidewalls along sides of said fins, wherein said dielectric material and a material of the sacrificial sidewalls are selectively etchable to each other;
   exposing sidewalls of upper portions of said pedestals below said sacrificial sidewalls, said upper portions being pedestal sub-fins;
   doping said pedestal sub-fins with an anti punch-though dopant;
   diffusing said anti punch-though dopant in said pedestal sub-fins and into bottom ends of said fins between said sacrificial sidewalls; and
   forming metal FET gates on said fins.

13. A method of forming an IC as in claim 12, wherein said dopant is boron (B) for N-type FETs (NFETs), and said dopant is selected from arsenic (As) and phosphorous (P) for P-type FETs (PFETs), and diffusing said anti punch-though dopant comprises Rapid Thermal Processing/Rapid Thermal Annealing (RTP/RTA) to activate and diffuse said anti punch-though dopant.

14. A method of forming an IC as in claim 13, wherein said first semiconductor material is a material selected from a group of materials consisting of silicon (Si), Germanium (Ge), SiGe and 11-V semiconductors, and said second semiconductor material is a material selected from a group of materials consisting of silicon, and 11-V semiconductors.

15. A method of forming an IC as in claim 14, wherein forming said dielectric material filling between said pedestals comprises:
   filling said trenches with said dielectric material;
   planarizing said dielectric material by chemical mechanical polish (CMP); and etching said dielectric material in said trenches to the top surfaces of said pedestals.

16. A method of forming an IC as in claim 15, wherein forming the sacrificial sidewalls comprises:
   forming a conformal layer of said sacrificial sidewall material on said wafer; and
   removing horizontal portions of said conformal layer, said sacrificial sidewalls remaining, each sacrificial sidewall extending from the etched trench dielectric material to the patterned hard mask on said fins.

17. A method of forming an IC as in claim 16, wherein exposing the sub-fin sidewalls comprises etching the trench dielectric material, and forming said metal gates comprises:
   removing the patterned hard mask and sacrificial sidewalls;
   forming dummy semiconductor gates on said fins;
   forming source/drain diffusions in said fins at opposite ends of said dummy semiconductor gates; and
   replacing said dummy semiconductor gates with metal.

18. A method of forming an IC as in claim 12, wherein doping said pedestal sub-fins comprises gas phase doping the exposed sub-fin sidewalls with a dopant.

19. A method of forming an IC as in claim 12, wherein doping said pedestal sub-fins comprises atomic layer doping the exposed sub-fin sidewalls with a dopant.

20. A method of forming an IC as in claim 16, wherein etching said trenches through said fin layer and said upper surface comprises using a reactive ion etch (RIE) through said patterned hard mask and removing horizontal portions of said conformal layer comprises directionally etching said conformal layer.

* * * * *